(12) United States Patent
Bunce et al.

(10) Patent No.: US 10,978,140 B2
(45) Date of Patent: Apr. 13, 2021

(54) RANDOM-ACCESS MEMORY ARRAY MEMORY CELL SELECTION

(71) Applicant: International Business Machines Corporation, Armonk, NY (US)

(72) Inventors: Paul Alan Bunce, Poughkeepsie, NY (US); John Davis, Wallkill, NY (US); Brian James Yavoich, Highland, NY (US); Russell Hayes, New Paltz, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/562,507

(22) Filed: Sep. 6, 2019

(65) Prior Publication Data

US 2021/0074351 A1    Mar. 11, 2021

(51) Int. Cl.
*G11C 11/00* (2006.01)
*G11C 11/417* (2006.01)
*G11C 11/412* (2006.01)

(52) U.S. Cl.
CPC .......... *G11C 11/417* (2013.01); *G11C 11/412* (2013.01)

(58) Field of Classification Search
CPC ...... G11C 11/417; G11C 11/412; G11C 11/00
USPC ........................................................ 365/154
See application file for complete search history.

(56) References Cited

U.S. PATENT DOCUMENTS

| 5,943,288 | A  | * | 8/1999  | Jiang ..................... G11C 7/22 365/194 |
| 6,282,135 | B1 | * | 8/2001  | Proebsting .............. G11C 7/065 257/E21.659 |
| 6,373,753 | B1 | * | 4/2002  | Proebsting .............. G11C 5/145 257/E21.659 |
| 8,345,481 | B2 |   | 1/2013  | Lee et al. |
| 2010/0085823 | A1 |   | 4/2010  | Carpenter et al. |
| 2010/0290290 | A1 |   | 11/2010 | Kono et al. |

OTHER PUBLICATIONS

Transmittal Form PTO/SB/21, signed Mar. 17, 2020.
Shinohara et al. "A Flexible Multiport RAM compiler for Data Path", IEEE Journal of Solid-State Circuits, vol. 26, No. 3, Mar. 1991, pp. 343-349.

* cited by examiner

*Primary Examiner* — Harry W Byrne
(74) *Attorney, Agent, or Firm* — Cantor Colburn LLP; William Kinnaman

(57) ABSTRACT

An aspect a bit selection path configured to propagate a bit selection signal. The bit selection path includes bit selection delay circuitry defining a bit selection delay. The memory array includes a row selection path configured to propagate a row selection signal. The row selection path includes row selection delay circuitry defining a row selection delay. The memory array includes local selection circuitry. The local selection circuitry is configured to receive the bit selection signal from the bit selection path before the row selection signal from the row selection path according to the bit selection delay and the row selection delay.

14 Claims, 5 Drawing Sheets

RANDOM-ACCESS MEMORY ARRAY MEMORY CELL SELECTION

BACKGROUND

The present disclosure relates to random-access memory arrays, and more specifically, to memory cell selection of random-access memory arrays.

SUMMARY

Embodiments include methods and systems for memory cell selection. A non-limiting example includes a memory array of static random-access memory. The memory array includes a bit selection path configured to propagate a bit selection signal. The bit selection path includes bit selection delay circuitry defining a bit selection delay. The memory array includes a row selection path configured to propagate a row selection signal. The row selection path includes row selection delay circuitry defining a row selection delay. The memory array includes local selection circuitry. The local selection circuitry is configured to receive the bit selection signal from the bit selection path before the row selection signal from the row selection path according to the bit selection delay and the row selection delay.

Embodiments also include a method for selecting a memory cell associated with a computer readable storage medium. The method includes receiving a row selection signal defined by a first memory cell value and a second memory cell value. The method includes receiving a bit selection signal before the row selection signal. The bit selection signal and the row selection signal have a propagation initialization at a substantially same time. The method includes selecting a one of the first memory cell value or the second memory cell value based on the bit selection signal. The method includes outputting an output signal of the one.

Embodiments also include a memory array of static random-access memory. The memory array includes a bit selection path configured to propagate a bit selection signal. The bit selection path includes bit selection delay circuitry defining a bit selection delay. The memory array includes a row selection path configured to propagate a row selection signal. The row selection path includes row selection delay circuitry defining a row selection delay less than the bit selection delay. The memory array includes local selection circuitry that includes a first NAND gate arrangement associated with a first header field-effect transistor and a second NAND gate arrangement associated with a second header field-effect transistor. The first header field-effect transistor and the second header field-effect transistor are configured to receive the bit selection signal from the bit selection path before the row selection signal from the row selection path is received.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein relate to cell selection for memory arrays. Memory arrays may include various cells arranged in columns, rows, and otherwise to provide accessible memory to computing systems. Access to stored values among the array may require cell selection. Cell selection may be performed based on received memory addresses. Memory addresses may be arranged according to specific rows, column, or other arrangements of memory cells within the array. As one of many possible examples, a memory address may include zeros and ones for selecting the necessary memory cell, representing low and high signal values of the memory array. As such, a particular memory cell or number of cells may be selected according to the corresponding signals. Memory arrays may be implemented in generic or specialized computing systems. As one non-limiting example, memory arrays may be implemented in computing hardware having processors, buses, input and output connections, display units, and other memory storage devices. Memory arrays may be implemented as computer readable mediums for use with any computing device or topography.

Figure 1:
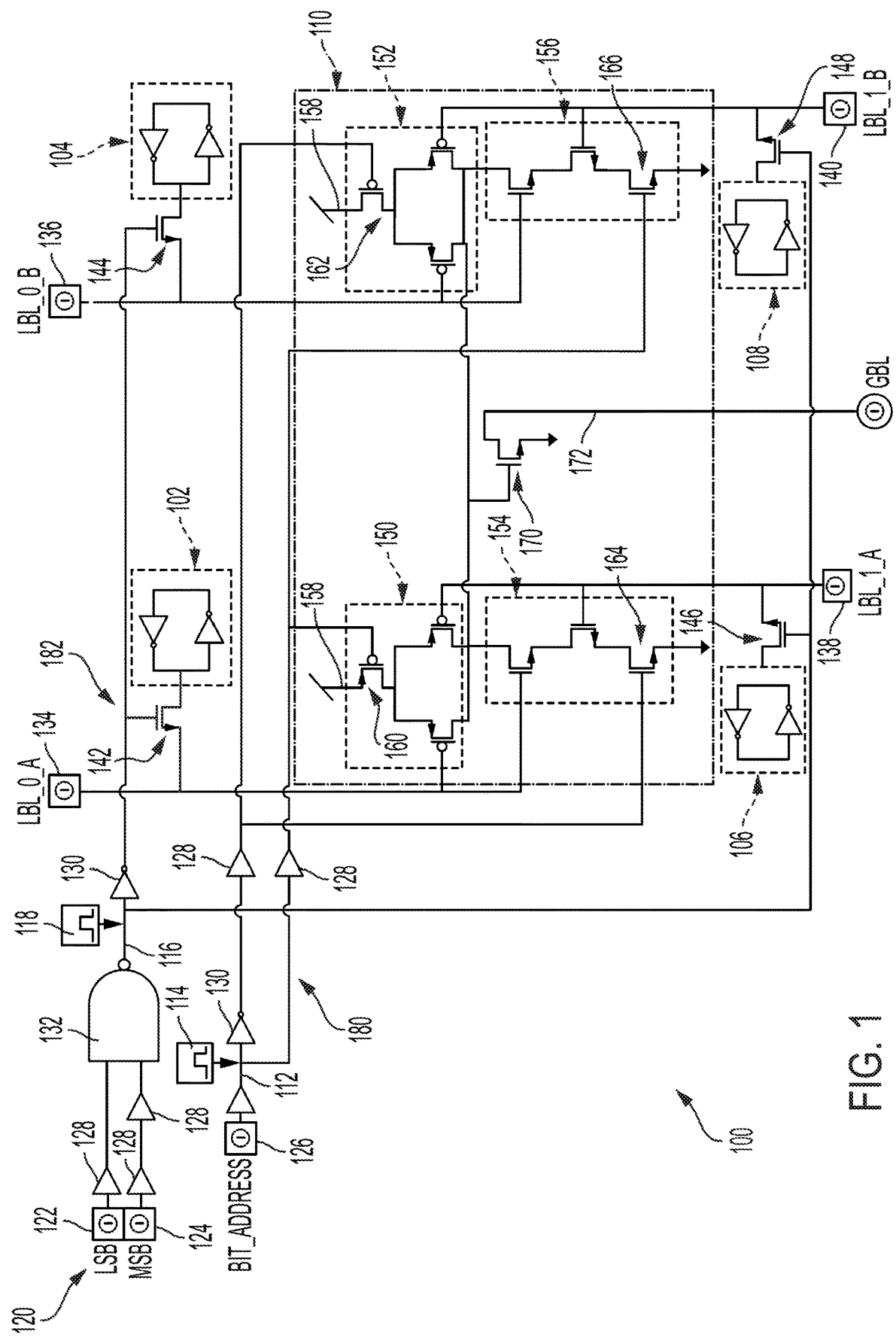
FIG. 1 illustrates a memory array of random-access memory having a multiple row selection paths in accordance with one or more embodiments.

Turning now to FIG. 1, a memory array 100 is generally shown in accordance with one or more embodiments of the present invention. The memory array 100 may be static random-access memory. The memory array 100 includes a first memory cell 102, a second memory cell 104, a third memory cell 106, and a fourth memory cell 108. The memory cells 102, 104, 106, 108 may be interchanged or renamed as necessary.

Local selection circuitry 110 may be configured to select one or more of the stored values in the memory cells 102, 104, 106, 108. The local selection circuitry 110 may include any number of selecting transistors, switches, or other implements to select one or more of the stored values in the memory cells 102, 104, 106, 108. The local selection circuitry 110 may be operated according to a bit selection path 112 and a row selection path 116. The row selection path 116 may select the first row of memory cells 102, 104 or the second row of memory cells 106, 108.

The bit selection path 112 may include or propagate a bit selection signal 114. The bit selection signal 114 may be defined by any electrical characteristic. As just one example, the bit selection signal 114 may be a voltage. The bit selection signal 114 may be formed according to a bit address 126. The bit address 126 may indicate a bit column and/or be a bit associated with a memory location. The bit address 126 may be amplified by a buffer or buffers 128. The bit selection path 112 may include individual paths to distinct locations on the local selection circuitry 110. The individual paths may include buffers 128 and one of the individual paths may include an inverter or inverters 130. The bit selection path 112 may include any number of circuitries or components to cause a propagation delay to the local selection circuitry 110.

The row selection path 116 may include or propagate a row selection signal 118. The row selection signal 118 may be defined by any electrical characteristic. As just one example, the row selection signal 118 may be a voltage. The row selection signal 118 may be formed according to a row selection address 120. The row selection address 120 may include, or at least include, a least significant bit signal 122 and a most significant bit signal 124. The least significant bit signal 122 and most significant bit signal 124 may be used through buffers 128 and NAND gate 132 to propagate the row selection signal 118 through individual paths. The individual paths of the row selection path 116 include retrieving store values of the memory cells 102, 104, 106, 108.

The row selection path 116 is associated with the first memory cell 102 and gathers the stored signal therein with transistor 142. Transistor 142 draws the stored signal and propagates the row selection signal 118 to the local selection circuitry 110 along the first-row bit line 134. The row selection path 116 is associated with the second memory cell 104 and gathers the stored signal therein with transistor 144. Transistor 144 draws the stored signal and propagates the row selection signal 118 to the local selection circuitry 110 along the second-row bit line 136. The row selection path 116 is associated with the third memory cell 106 and gathers the stored signal therein with transistor 146. Transistor 146 draws the stored signal and propagates the row selection signal 118 to the local selection circuitry 110 along the third-row bit line 138. The row selection path 116 is associated with the fourth memory cell 108 and gathers the stored signal therein with transistor 148. Transistor 148 draws the stored signal and propagates the row selection signal 118 to the local selection circuitry 110 along the fourth-row bit line 140.

The local selection circuitry 110 may include a first NAND gate arrangement 150. The first NAND gate arrangement 150 may include a first header field-effect transistor 160. The first header field-effect transistor 160 may be associated with a power source 158. The first header field-effect transistor 160 may be configured to receive the bit selection signal 114. The local selection circuitry 110 may include a second NAND gate arrangement 152. The second NAND gate arrangement 152 may include a second header field-effect transistor 162. The second header field-effect transistor 162 may be associated with the power source 158. The second header field-effect transistor 162 may be configured to receive the bit selection signal 114.

The inverter 130 on the bit selection path 112 may ensure that the bit selection path 112 is configured for conduction to the first header field-effect transistor 160 when the bit selection path 112 is configured to impede conduction to the second header field-effect transistor 162. The inverter 130 on the bit selection path 112 may ensure that the bit selection path 112 is configured to impede conduction to the first header field-effect transistor 160 when the bit selection path 112 is configured for conduction to the second header field-effect transistor 162. The first NAND gate arrangement 150 and the second NAND gate arrangement 152 may consist of p-type metal-oxide-semiconductors (PMOS).

The local selection circuitry 110 may include a third NAND gate arrangement 154. The third NAND gate arrangement 154 may include a third header field-effect transistor 164. The third header field-effect transistor 164 may be configured to receive the bit selection signal 114. The local selection circuitry 110 may include a fourth NAND gate arrangement 156. The fourth NAND gate arrangement 156 may include a fourth header field-effect transistor 166. The second header field-effect transistor 162 may be configured to receive the bit selection signal 114. The third NAND gate arrangement 154 and the fourth NAND gate arrangement 156 may consist entirely of n-type metal-oxide-semiconductors (NMOS).

The local selection circuitry 110 is configured to receive the row selection signal 118 along with the stored signals in memory cells 102, 104, 106, 108. The first NAND gate arrangement 150, second NAND gate arrangement 152, third NAND gate arrangement 154, and fourth NAND gate arrangement 156 may be associated with the row selection signal 118 based on the respective memory cells 102, 104, 106, 108. That is, the NAND gate arrangements 150, 152, 154, 156 are collectively configured to pass one of the stored signals of memory cells 102, 104, 106, 108 to the global bit line or output signal 172. The output signal 172 may be energized based on the global bit line transistor 170. As such, one or more of the stored signals of memory cells 102, 104, 106, 108 may be propagated to the output signal 172.

The bit selection path 112 may include bit selection delay circuitry 180. The bit selection delay circuitry 180 may include the conduction path between the bit address 126 and the local selection circuitry 110. The bit selection delay circuitry 180 may include the buffers 128, inverters 130, or any other circuitry along the bit selection path 112. As such, the bit selection signal 114 is delayed along the bit selection path 112 by a predetermined amount. The bit selection signal 114 may be delayed a predetermined amount such that the bit selection signal 114 reaches the local selection circuitry 110 before the row selection signal 118. That is, the bit selection delay of the bit selection signal 114 may be less than the row selection delay 304 (FIG. 4) of the row selection signal 118. The row selection path 116 may include row selection delay circuitry 182 that may include the conduction path between the row selection address 120 and the local selection circuitry 110. As an example, the row selection delay circuitry 182 may include buffers 128, inverters 130, NAND gate 132, memory access transistors 142, 144, 146, 148, memory cells 102, 104, 106, 108, or any combination thereof.

Figure 2:
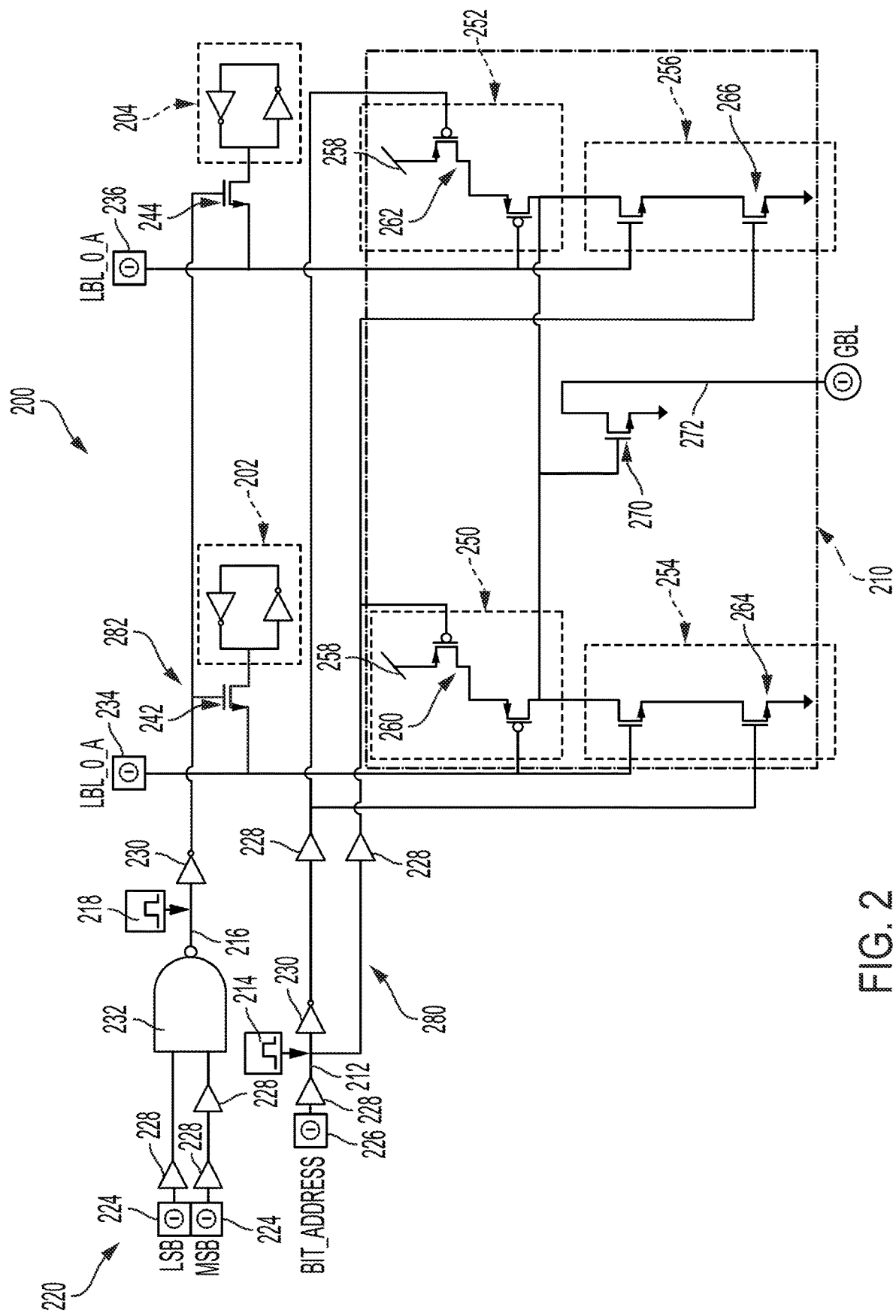
FIG. 2 illustrates a memory array of random-access memory having a single row selection path in accordance with one or more embodiments.

Turning now to FIG. 2, a memory array 200 is generally shown in accordance with one or more embodiments of the present invention. The memory array 200 may be static random-access memory. The memory array 200 includes a first memory cell 202 and a second memory cell 204. The memory cells 202, 204 may be interchanged or renamed as necessary.

Local selection circuitry 210 may be configured to select one or more of the stored values in the memory cells 202, 204. The local selection circuitry 210 may include any number of selecting transistors, switches, or other implements to select one or more of the stored values in the memory cells 202, 204. The local selection circuitry 210 may be operated according to a bit selection path 212 and a row selection path 216. The row selection path 216 selects select the first row of memory cells 202, 204.

The bit selection path 212 may include or propagate a bit selection signal 214. The bit selection signal 214 may be defined by any electrical characteristic. As just one example, the bit selection signal 214 may be a voltage. The bit selection signal 214 may be formed according to a bit address 226. The bit address 226 may indicate a bit column and/or be a bit associated with a memory location. The bit address 226 may be amplified by a buffer or buffers 228. The bit selection path 212 may include individual paths to distinct locations on the local selection circuitry 210. The individual paths may include buffers 228 and one of the individual paths may include an inverter or inverters 230. The bit selection path 212 may include any number of circuitries or components to cause a propagation delay to the local selection circuitry 210.

The row selection path 216 may include or propagate a row selection signal 218. The row selection signal 218 may be defined by any electrical characteristic. As just one example, the row selection signal 218 may be a voltage. The row selection signal 218 may be formed according to a row selection address 220. The row selection address 220 may include, or at least include, a least significant bit signal 222 and a most significant bit signal 224. The least significant bit signal 222 and most significant bit signal 224 may be used through buffers 228 and NAND gate 232 to propagate the row selection signal 218 through individual paths. The individual paths of the row selection path 216 include retrieving store values of the memory cells 202, 204.

The row selection path 216 is associated with the memory cell 202 and gathers the stored signal therein with transistor 242. Transistor 242 draws the stored signal and propagates the row selection signal 218 to the local selection circuitry 210 along the first-row bit line 234. The row selection path 216 is associated with the memory cell 204 and gathers the stored signal therein with transistor 244. Transistor 244 draws the stored signal and propagates the row selection signal 218 to the local selection circuitry 210 along the second-row bit line 236.

The local selection circuitry 210 may include a first tristate arrangement 250. The first tristate arrangement 250 may include a first header field-effect transistor 260. The first header field-effect transistor 260 may be associated with a power source 258. The first header field-effect transistor 260 may be configured to receive the bit selection signal 214. The local selection circuitry 210 may include a second tristate arrangement 252. The second tristate arrangement 252 may include a second header field-effect transistor 262. The second header field-effect transistor 262 may be associated with the power source 258. The second header field-effect transistor 262 may be configured to receive the bit selection signal 214.

The inverter 230 on the bit selection path 212 may ensure that the bit selection path 212 is configured for conduction to the first header field-effect transistor 260 when the bit selection path 212 is configured to impede conduction to the second header field-effect transistor 262. The inverter 230 on the bit selection path 212 may ensure that the bit selection path 212 is configured to impede conduction to the first header field-effect transistor 260 when the bit selection path 212 is configured for conduction to the second header field-effect transistor 262. The first tristate arrangement 250 and the second tristate arrangement 252 may consist of p-type metal-oxide-semiconductors (PMOS).

The local selection circuitry 210 is configured to receive the row selection signal 218 along with the stored signals in memory cells 202, 204. The first tristate arrangement 250, second tristate arrangement 252 may be associated with the row selection signal 218 based on the respective memory cells 202, 204. That is, the tristate arrangements 250, 252 are collectively configured to pass one of the stored signals of memory cells 202, 204 to the global bit line or output signal 272. The output signal 272 may be energized based on the global bit line transistor 270. As such, one or more of the stored signals of memory cells 202, 204 may be propagated to the output signal 272.

The bit selection path 212 may include bit selection delay circuitry 280. The bit selection delay circuitry 280 may include the conduction path between the bit address 226 and the local selection circuitry 210. The bit selection delay circuitry 280 may include the buffers 228, inverters 230, or any other circuitry along the bit selection path 212. As such, the bit selection signal 214 is delayed along the bit selection path 212 by a predetermined amount. The bit selection signal 214 may be delayed a predetermined amount such that the bit selection signal 214 reaches the local selection circuitry 210 before the row selection signal 218. That is, the bit selection delay of the bit selection signal 214 may be less than the row selection delay 304 (FIG. 4) of the row selection signal 218. The row selection path 216 may include row selection delay circuitry 282 that may include the conduction path between the row selection address 220 and the local selection circuitry 210. As an example, the row selection delay circuitry 282 may include buffers 228, inverters 230, NAND gate 232, memory access transistors 242, 244 memory cells 202, 204, or any combination thereof. The local selection circuitry 210 may include NAND gate arrangements 254, 256. The NAND gate arrangements may cooperate with the tristate arrangements 250, 252 to ensure only one of the memory cells 202, 204 conveys data to the global bit line or output signal 272. These NAND gate arrangements may include NMOS transistors. The NAND gate arrangement 254 may include a header field-effect transistor 264. The header field-effect transistor 264 may be configured to receive the bit selection signal 214. The NAND gate arrangement 256 may include a header field-effect transistor 266. The header field-effect transistor 266 may be configured to receive the bit selection signal 214.

In light of the foregoing, it should be appreciated that any combination of logic or local selection circuitry may be used to select the proper memory cells 102, 104, 106, 108, 202, 204. Further, any combination of NAND gates, tristates, arrangements, or combinations thereof may be implemented. References to FIG. 1 or 2 throughout this disclosure may correspond to the teachings of FIG. 1, 2, or a combination thereof.

Figure 3:
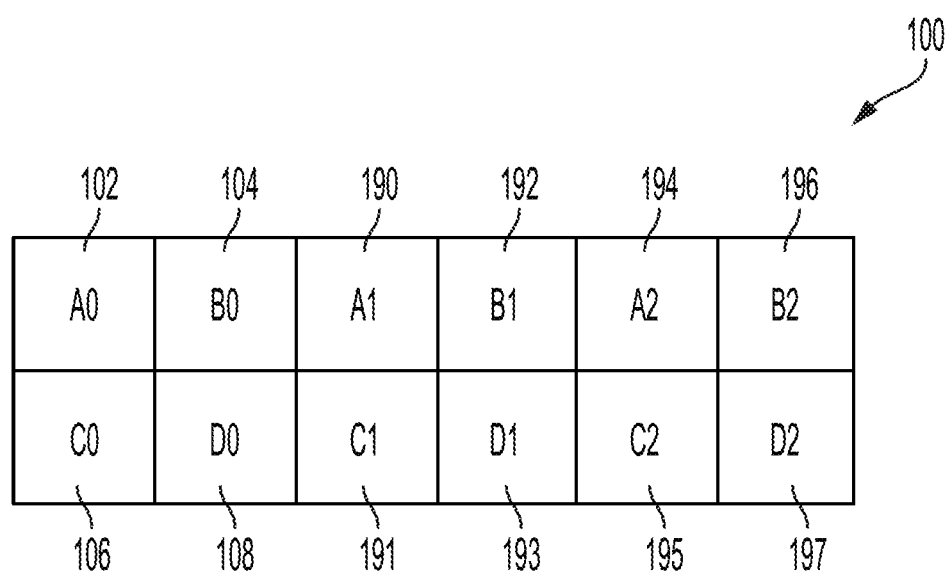
FIG. 3 illustrates interleaved memory segments in accordance with one or more embodiments.

Referring to FIG. 3, the memory array 100 of FIG. 1 is generally shown in accordance with one or more embodiments of the present invention. The memory array 100 includes memory cells 102, 104, 106, 108, 190, 191, 192, 193, 194, 195, 196, 197. The memory cells 102, 104, 106, 108, 190, 191, 192, 193, 194, 195, 196, 197 are interleaved to form interleaved memory segments. The first memory segment includes memory cells 102, 190, 194. The second memory segment includes memory cells 104, 192, 196. The third memory segment includes memory cells 106, 191, 195. The fourth memory segment includes memory cells 108, 193, 197. The interleaved memory segments may provide improved memory access times.

Figure 4:
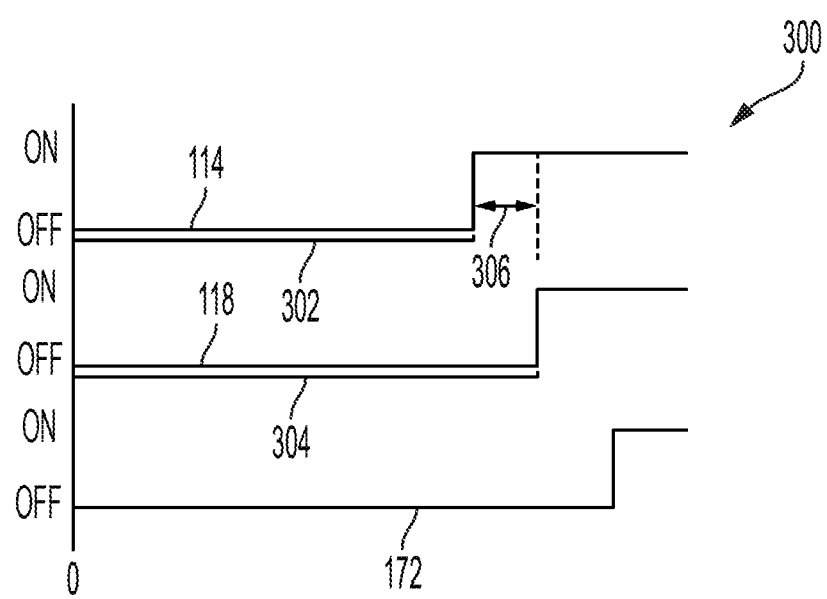
FIG. 4 illustrates delay associated with conduction paths of memory arrays.

Referring to FIG. 4, a graph 300 is generally shown in accordance with one or more embodiments of the present invention. The graph 300 includes a bit selection delay 302. The bit selection delay 302 is defined by the bit selection delay circuitry 180 of FIG. 1. The bit selection delay circuitry 180 may be defined by any combination of wiring, conduction paths, semi conductive elements, elementary elements, or any combination thereof. The bit selection delay may only include buffer delay from buffers 128, inverter delay from inverters 130, and conduction delay from the bit selection path 112. The graph 300 includes a row selection delay 304. The row selection delay 304 is defined by the row selection delay circuitry 182. The row selection delay circuitry 182 may be defined by any combination of wiring, conduction paths, semi conductive elements, elementary elements, or any combination thereof. A delay gap 306, based on the bit selection delay 302 and the row selection delay 304, may be defined by a necessary gap required to ensure only the selected memory cells defined by the received memory address including the row selection address 120 and the bit address 126 are propagated down the output signal 172. The bit selection signal 114 and the row selection signal 118 may begin propagation at that the same time. That is, the bit selection signal 114 and the row selection signal 118 may have a propagation initialization 308 at substantially the same time. As one example, the memory address provided and associated with the row selection address 120 and the bit address 126 may be initialized or propagated at the same time with respect to the origination points associated with the row selection address 120 and the bit address 126.

Figure 5:
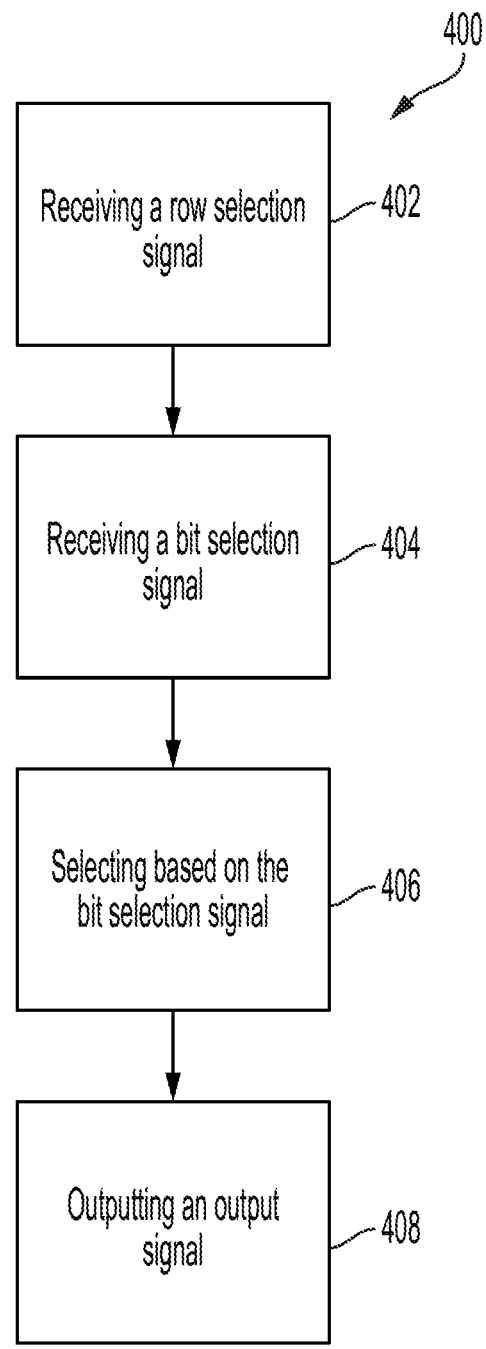
FIG. 5 illustrates a generalized flow chart of operations performed according to one embodiment of the invention.

Referring to FIG. 5, a flow diagram 400 is generally shown in accordance with one or more embodiments of the present invention and described with reference to FIGS. 1-4. Although described with respect to the memory array 100 of FIG. 1, it will be understood that the method depicted in the flow diagram 400 can be implemented in the memory array 200 of FIG. 2, and other such configurations. The flow diagram 400 includes receiving a row selection signal 118 in block 402. As an example, the local selection circuitry 110 may receive the row selection signal 118. The row selection signal 118 may include the value of a first memory cell 102 and the value of a second memory cell 104. The first memory cell value and second memory cell value may be stored values associated with the memory cell. In block 404, a bit selection signal 114 is received. The bit selection signal 114 may be received by the local selection circuitry 110. The bit selection signal 114 may be received by the local selection circuitry 110 before the row selection signal 118, including the memory cell value, is received even though the propagation initialization 308 is at substantially the same time. In block 406, one of the first memory cell value or the second memory cell value is selected based on the bit selection signal 114. Responsive to the selection in block 406, an output signal 172 is propagated along the global bit line according to the selection.

The row selection signal 118 may be further defined by a third memory cell value associated with the third memory cell 106 and a fourth memory cell value associated with the fourth memory cell 108. The first memory cell value associated with the first memory cell 102 and the third memory cell value associated with the third memory cell 106 may be selected, or the second memory cell value associated with the second memory cell 104 and the fourth memory cell value associated with the fourth memory cell 108 may be selected based on gate arrangements associated with the local selection circuitry 110. The output signal 172 may be sent responsive to receiving the row selection signal 118. As one example, the local selection circuitry 110 may receive the bit selection signal 114, then receive the row selection signal 118. Responsive to receiving the row selection signal 118, the local section circuitry may output the output signal 172 along the global bit line in block 408.

As used herein, the term memory is used to refer to any device capable of storing data such as, but not limited to a static random-access memory (SRAM), dynamic random-access memory (DRAM) device, or a flash memory device. The physical memory device includes memory addresses that define memory locations for storing data and the physical memory device may be associated with virtual memory.

In an exemplary embodiment, the methods described herein can be implemented with any or a combination of the following technologies, which are each well known in the art: a discreet logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array of static random-access memory, the memory array comprising:
   a bit selection path configured to propagate a bit selection signal, the bit selection path comprising bit selection delay circuitry defining a bit selection delay;
   a row selection path configured to propagate a row selection signal, the row selection path comprising row selection delay circuitry defining a row selection delay; and
   local selection circuitry configured to receive the bit selection signal from the bit selection path before the row selection signal from the row selection path according to the bit selection delay and the row selection delay.

2. The memory array of claim 1, wherein the row selection delay circuitry comprises a transistor associated with a memory cell of the row selection path, and the bit selection delay circuitry comprises a buffer associated with the bit selection path.

3. The memory array of claim 2, wherein the local selection circuitry comprises a first NAND gate arrangement associated with a first header field-effect transistor and a second NAND gate arrangement associated with a second header field-effect transistor, and the first header field-effect transistor and the second header field-effect transistor are configured to receive the bit selection signal from the bit selection path before the row selection signal from the row selection path is received.

4. The memory array of claim 3, wherein the bit selection path is configured for conduction to the first header field-effect transistor based on the bit selection path being configured to impede conduction to the second header field-effect transistor, and the bit selection path is configured to impede conduction to the first header field-effect transistor based on the bit selection path being configured for conduction to the second header field-effect transistor.

5. The memory array of claim 4, wherein the bit selection path comprises an inverter associated with the second header field-effect transistor.

6. The memory array of claim 3, wherein the first NAND gate arrangement and the second NAND gate arrangement consist of PMOS.

7. The memory array of claim 2, wherein the row selection path comprises a first memory segment interleaved with a second memory segment and a third memory segment interleaved with a fourth memory segment.

8. The memory array of claim 7, wherein the local selection circuitry comprises:

a first NAND gate arrangement associated with a first header field-effect transistor and a second NAND gate arrangement associated with a second header field-effect transistor, and the first header field-effect transistor and the second header field-effect transistor are configured to receive the bit selection signal from the bit selection path before the row selection signal from the row selection path is received;

the bit selection path is configured for conduction to the first header field-effect transistor based on the bit selection path being configured to impede conduction to the second header field-effect transistor, and the bit selection path is configured to impede conduction to the first header field-effect transistor based on the bit selection path being configured for conduction to the second header field-effect transistor; and a third NAND gate arrangement associated with a third header field-effect transistor and a fourth NAND gate arrangement associated with a fourth header field-effect transistor, and the third header field-effect transistor and the fourth header field-effect transistor are configured to receive the bit selection signal from the bit selection path before the row selection signal from the row selection path is received.

9. The memory array of claim 8, wherein the third NAND gate arrangement and the fourth NAND gate arrangement consists of NMOS.

10. The memory array of claim 8, wherein the bit selection path is configured for conduction to the third header field-effect transistor when the bit selection path is configured to impede conduction to the fourth header field-effect transistor, and the bit selection path is configured to impede conduction to the third header field-effect transistor based on the bit selection path being configured for conduction to the fourth header field-effect transistor.

11. The memory array of claim 10, wherein the bit selection path is configured for conduction to the first NAND gate arrangement and the fourth NAND gate arrangement based on the bit selection path being configured to impede conduction to the second NAND gate arrangement and the third NAND gate arrangement.

12. The memory array of claim 2, wherein the local selection circuitry includes a first tristate arrangement associated with a first header field-effect transistor and a second tristate arrangement associated with a second header field-effect transistor, and the first header field-effect transistor and the second header field-effect transistor are configured to receive the bit selection signal from the bit selection path before the row selection signal from the row selection path is received.

13. The memory array of claim 12, wherein the bit selection path comprises an inverter associated with the second header field-effect transistor.

14. The memory array of claim 12, wherein the first tristate arrangement and the second tristate arrangement consist of PMOS.

* * * * *